United States Patent [19]

Moger

[11] Patent Number: 4,752,749
[45] Date of Patent: Jun. 21, 1988

[54] FAST RESPONSE TUNER

[75] Inventor: George A. Moger, Marion, Iowa

[73] Assignee: Rockwell International Corporation, El Segundo, Calif.

[21] Appl. No.: 945,916

[22] Filed: Dec. 22, 1986

[51] Int. Cl.$^4$ .............................................. H03L 7/10
[52] U.S. Cl. ........................................ 331/17; 331/25
[58] Field of Search ................ 331/17, 18, 25, DIG. 2

[56] References Cited

U.S. PATENT DOCUMENTS

| | | | |
|---|---|---|---|
| 4,007,429 | 2/1977 | Cadalora | 331/DIG. 2 X |
| 4,034,310 | 7/1977 | Coe | 331/DIG. 2 X |
| 4,321,555 | 3/1982 | Howk et al. | 331/1 A |
| 4,500,857 | 2/1985 | Bosselaers et al. | 331/DIG. 2 X |
| 4,503,401 | 3/1985 | Kyriakos et al. | 331/4 |
| 4,511,858 | 4/1985 | Charavit et al. | 331/10 |
| 4,516,083 | 5/1985 | Turney | 331/DIG. 2 X |
| 4,523,150 | 6/1985 | Hogeboom | 328/133 |
| 4,546,329 | 10/1985 | Unger | 331/DIG. 2 X |
| 4,559,505 | 12/1985 | Suarez et al. | 331/1 A |
| 4,568,888 | 2/1986 | Kimura et al. | 331/10 |
| 4,573,026 | 2/1986 | Curtis et al. | 332/18 |
| 4,600,896 | 7/1986 | Cellerino | 331/11 |

Primary Examiner—Eugene R. Laroche
Assistant Examiner—David Mis
Attorney, Agent, or Firm—M. Lee Murrah; V. Lawrence Sewell; H. Fredrick Hamann

[57] ABSTRACT

Frequency disturbances caused by voltage fluctuations which occur when a bandwidth limiting lag network is switched in and out of a frequency synthesizer circuit to provide the wide bandwidth necessary for fast frequency hopping are eliminated by the invention. Rather than switching a parallel charging source for the large network capacitor out of the circuit during each hopping interval, the capacitor is charged in series to a constant level during narrow bandwidth mode and charged on both plates in consonance with the input voltage during the wide bandwidth mode to thereby render the lag network active during the narrowband mode and transparent during the wideband mode.

17 Claims, 1 Drawing Sheet

FAST RESPONSE TUNER

BACKGROUND OF THE INVENTION

The invention relates to radio frequency tuners, and more particularly to such tuners which employ a phase-locked-loop as a frequency generation element.

Phase-locked-loops are commonly used in circuits to produce a precise, stable frequency. They can be used both as an oscillator in a receiver to detect signals of a prescribed frequency and as a frequency synthesizer in a transmitter to generate an output signal having a selectively variable frequency. The basic elements of a phase-locked-loop (PLL) include a voltage controlled oscillator (VCO) for producing an output signal having a controlled frequency, a phase detector for comparing the phase of the output signal with that of a predetermined reference signal and for producing an error signal representing the detected phase difference, and a loop filter for filtering the error signal and coupling it to the VCO to controllably adjust the output signal's frequency.

In applications such as frequency hopping transmitters and receivers, the frequency of a PLL synthesizer must be changed quickly. For fast frequency changes, it is desirable that the PLL filter have a wide bandwidth. Once a new frequency is attained, however, it is desirable that the filter have a narrow bandwidth to remove noise which may cause frequency disturbances. The need for two separate bandwidths for the two operating modes has been commonly met by providing a switchable lag network following the loop filter. However, such switching introduces voltage transients which render the VCO output unstable for a length of time, and the output is thus not usable until the VCO frequency stabilizes. The transients usually result from an inability to maintain a constant DC voltage level on a capacitor in the lag network in both wideband and narrowband modes. The settling time is usually too long for use in a frequency hopping system.

It is therefore an object of the present invention to provide a means for changing bandwidth in a PLL synthesizer, or the like, which is suitable for use in frequency hopping receivers and transmitters.

It is another object of the present invention to provide means for changing bandwidth in a PLL synthesizer which minimizes frequency disturbances.

It is a further object of the present invention to provide means for changing bandwidth in a PLL synthesizer which is fast.

It is an additional object of the present invention to provide means for changing bandwidth in a PLL synthesizer which eliminates the need for extremely accurate components.

SUMMARY

With these and other objects in view, the present invention provides a lag network in which the DC voltage on the lag network capacitor is made irrelevant by never changing it. The wideband and narrowband modes are provided by providing identical PLL loop signals to both plates of the lag network capacitor and switching one side of the capacitor between low and high impedance states. Thus, in the high impedance state no current flows in the lag capacitor rendering the lag network transparent to loop signals and thus providing a wide bandwidth state. In the low impedance state loop AC signals are provided a sink path, thereby switching the lag network into the circuit and thus providing a narrow bandwidth state. Since the DC voltage on the lag capacitor never changes, transients which would disturb the VCO are not induced.

BRIEF DESCRIPTION OF THE DRAWINGS

The invention may be more fully understood by reading the following description of a preferred embodiment thereof in conjunction with the appended drawings, wherein.

DESCRIPTION OF A PREFERRED EMBODIMENT

Figure 1:
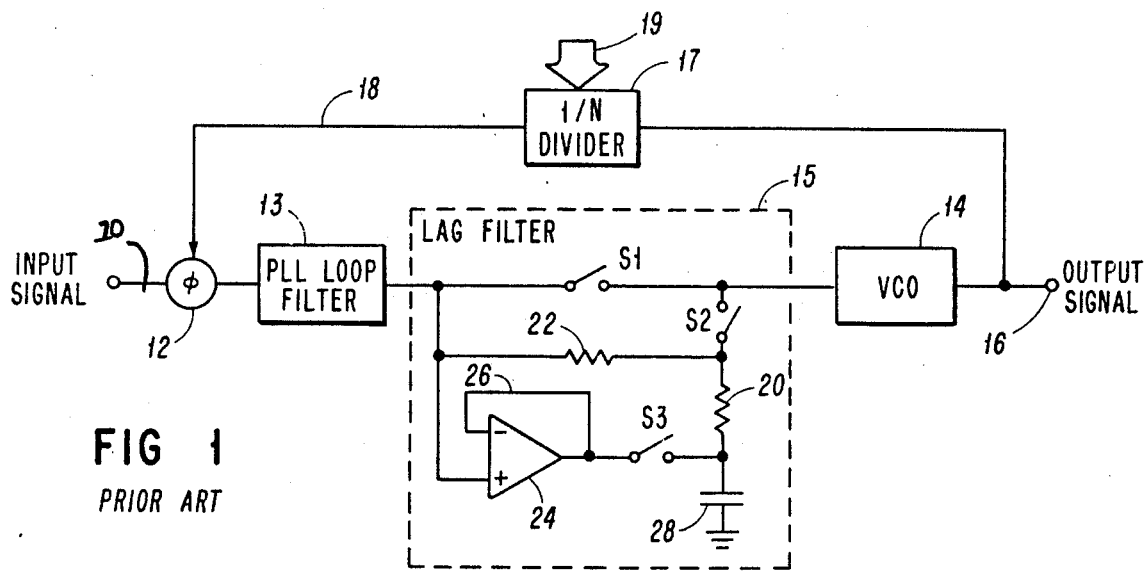
FIG. 1 is a schematic diagram of a prior art circuit for changing PLL bandwidth during frequency hopping.

A switching circuit for changing bandwidth in a PLL synthesizer as practiced in the prior art is shown in FIG. 1. A varying DC input voltage is provided via terminal 10 to one input of a phase comparator 12. The output from phase comparator 12 is coupled through a PLL loop filter 13 and a lag filter 15 to the input of a voltage-controlled-oscillator (VCO) 14. The output of VCO 14 is provided both to an output terminal 16 and to a second input of phase comparator 12 through a 1/N divider 17 via a feedback line 18.

Lag filter 15 has a switch S1 intercoupled between phase comparator 12 and the input of VCO 14. A second switch S2 is also coupled between the input of VCO 14 and a resistor 20. Switch S2 is also coupled to a resistor 22, the second side of which is coupled to the output of phase comparator 12. Coupled in parallel to resistor 20 and 22 is a differential amplifier 24, via the positive terminal (+) thereof. The negative (−) is connected in a feedback loop 26 to the output of amplifier 24 to provide unity gain. The output of amplifier 24 is coupled through a switch S3 to resistor 20, which in turn is coupled to a capacitor 28, the other side of which is coupled to reference potential. Shorn of switches S1, S2 and S3, and amplifier 24, lag filter 15 is equivalent to the standard lowpass filter shown in FIG. 2.

Figure 2:
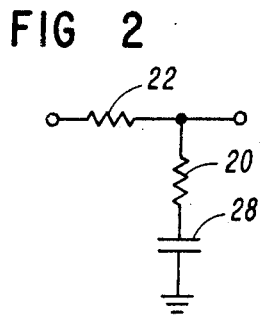
FIG. 2 is a simplified circuit diagram of the lag filter included in the circuit of FIG. 1 and in the circuit of the present invention.

If the lag network in its simplified form shown in FIG. 2 were retained in the PLL network of FIG. 1, the time required to tune from one frequency to another would be extended beyond the required limits for frequency hopping operation. However, switching lag network 15 in and out of the PLL circuit during frequency hopping intervals, while solving the tuning speed problem, causes voltage transients at the input of VCO 14 which render the output frequency unstable for an unacceptable length of time. The addition of switches S1, S2 and S3 and amplifier 24 are an attempt as practiced in the prior art to remove the lag network during frequency hopping intervals without disturbing voltage transients.

Thus, during the narrow bandwidth operational mode, switch S2 is closed and switches S1 and S3 are open. In this configuration, lag network 15 comprises the simplified network shown in FIG. 2. Thus, the output signal from phase comparator 12 is low pass filtered by PLL loop filter 13 to remove high frequency components, and the result is applied to VCO 14, which produces an output signal at terminal 16. A portion of the output signal is fed back via feedback loop 18 to phase comparator 12 where it is compared to the input signal at terminal 10. The signal fed back to phase comparator 12 may be reduced in frequency by a 1/N divider in response to an input device 19, which may for example be an appropriately connected tuning knob or switches. The difference signal is then processed through lag network 15 and applied to VCO 14.

During the wide bandwidth fast tuning mode, switches S1 and S3 are closed and switch S2 is open, thus switching lag network 15 out of the circuit. However, when the lag network is switched back into the circuit, the voltage on capacitor 28, and thus at the node between resistors 20 and 22, must match that being presented to the VCO just prior to switching. Otherwise, VCO 14 will be presented a step function change in voltage which will cause frequency instability until the resulting transient voltage variations die out. The prior art solution attempts to maintain the voltage on capacitor 28 the same as that appearing at the input of VCO 14 when lag filter 15 is switched out of the circuit by the addition of charging amplifier 24. According to the theory, amplifier 24 will rapidly charge capacitor 28 through switch S3 to exactly the same voltage as the control voltage then being presented to VCO 14. If this is true, then when the circuit is switched from wide bandwidth to narrow bandwidth operation by closing switch S2 and opening switches S1 and S3, capacitor 28 will already be charged to the same voltages as the control voltage, and thus no disturbance will occur. In reality, the output of amplifier 24 is usually at least several millivolts different from its input. With a typical VCO gain constant of 5 MHz change for a one voltage change in control voltage, and a 3 mv difference between the input and output voltages of amplifier 24, the resulting frequency disturbance would be:

Frequency disturbance $= (5 \times 10^6)(0.0003) = 15,000$ Hz.

Thus, under these circumstances, a 15 kHz frequency disturbance will occur when switch S2 is closed, rendering the system useless during the disturbance. Typically, a disturbance of 100 Hz or less is required to permit a system to continue proper operation. Working the equation just presented in the reverse shows that to keep the disturbance below 100 Hz the voltage on capacitor 28 must be charged to within 20 microvolts of the control voltage. This degree of accuracy is several hundred times the present technical design capability of a good DC amplifier such as amplifier 24.

Another problem inherent in the prior art circuit is the difficulty in charging capacitor 28 fast enough. Tune times on the order of 100 microseconds are typical, and the value of capacitor 28 is typically in the 1 to 50 microfarad range. This requires an amplifier that is capable of many amperes of drive current, which severely complicates the already-difficult design requirements of amplifier 24. Switch S3 must be capable of passing these very high charge currents and must have a very low resistance. All past attempts to design a fast bandwidth reduction system have addressed the problems of charging capacitor 28 quickly and accurately but with very limited success.

Figure 3:
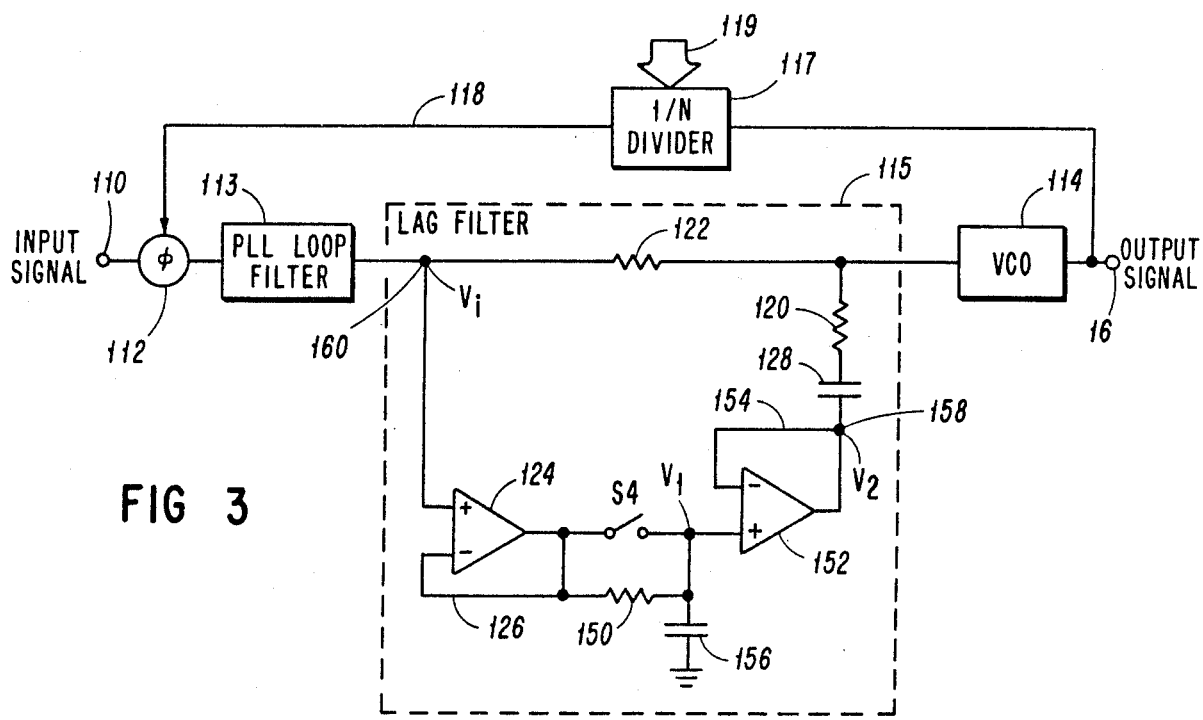
FIG. 3 is a schematic diagram of a circuit for changing PLL bandwidth during frequency hopping in accordance with the present invention and FIG. 4 is a graph showing the manner in which the PLL bandwidth is changed during operation of the circuit of FIG. 3.

The circuit of the present invention for addressing the failures of the prior art is shown in FIG. 3. Circuit elements equivalent to those shown in FIG. 1 are given the numerals having the same ones and tens digits. The only difference between the circuits of FIGS. 1 and 3 is in the switchable lag filter 115.

In the lag network 115 PLL loop filter 113 and VCO 114 are intercoupled through resistor 122. Resistor 120 is coupled both to VCO 114 and resistor 122 on one side and to capacitor 128 on the other side. PLL loop filter 113 and resistor 122 are both coupled at node 160 to the positive (+) input of differential amplifier 124, the negative (−) input of which is coupled to its output via feedback loop 126 to provide unity gain. The output of amplifier 124 is coupled through the parallel combination of switch S4 and resistor 150 to the positive (+) input of a differential amplifier 152, the negative (−) input of which is coupled to its output via a feedback loop 154 to provide unity gain. The output of amplifier 152 is coupled to capacitor 128 at node 158. The positive input of amplifier 152, switch S4, and resistor 150 are coupled to a capacitor 156, the second side of which is tied to reference ground. Although switch S4 is shown as a conventional switch, it should be understood that any other switch or switching device, such as a field-effect-transistor, could be used.

This circuit configuration removes the capacitor charging problem by not changing the charge on capacitor 128. The DC voltage on lag capacitor 128 is irrelevant to its operation, and all that is required is that node 158 be returned to a low impedance state. The impedance at low impedance node 158 should be at least 1/10 of the value of resistor 120. The effect is exactly the same as in the prior art circuit when node 158 was grounded. In other words, node 158 becomes a current sink, or load.

During wide bandwidth operation switch S4 is closed, which allows amplifier 124 to charge capacitor 156 (which has a small value, typically about 0.01 microfarads) in step with the voltage at node 160. This voltage will then be duplicated at node 158 through unity gain amplifier 152 such that the bottom side of capacitor 128 tracks the voltage at node 160. The voltage differential across capacitor 128 is thus zero, and no current will flow in the lag network components (resistor 120 and 122 and capacitor 128). They will thus appear to be transparent to the circuit and will have no effect on the loop bandwidth, thereby permitting the loop to quickly lock on a new frequency. In this configuration the problem of charging capacitor 128 has been eliminated since it is not charged except upon circuit initiation.

Figure 4:
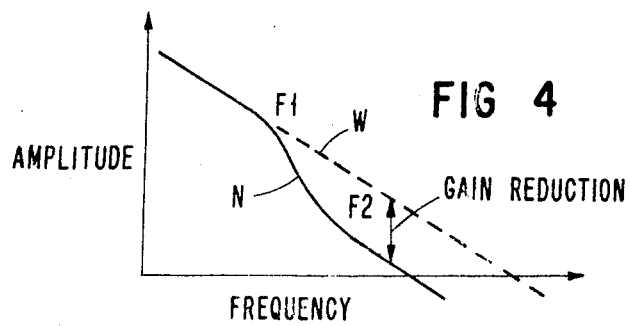

To put the lag network into effect, switch S1 is opened. If resistor 150 is chosen to have a large value, this stabilizes voltages V1 and V2 with respect to Vi such that V1 and V2 can no longer follow the AC variations of Vi. The cutoff frequency at which V1 and V2 can no longer follow Vi is set by resistor 150 and capacitor 156. As long as the frequency cutoff corner formed by resistor 150 and capacitor 156 is below F1 of the lag network where F1 is defined as:

$F1 = 1[(R1 + R2) C 2\lambda)]$ where R1 is resistor 122, R2 is resistor 120, and C is capacitor 128, the lag network performs normally and reduces the bandwidth of the loop by $R2/(R1+R2)$. Since the charge on capacitor 128, and thus its DC voltage is never changed, no frequency disturbance at all occurs when the gain reduction takes place. The manner in which the bandwidth (i.e., gain as a function of frequency) is changed by the operation of the present invention is shown in FIG. 4. During wideband operation the gain as a function of frequency is represented by line W. During narrowband operation, however, the gain is represented by curve N which exhibits two frequency "corners" at frequencies F1 and F2.

While particular embodiments of the invention have been shown and described, it is obvious that minor changes and modifications may be made therein without departing from the true scope and spirit of the invention. It is the intention of the appended claims to cover all such changes and modifications.

I claim:

1. In a phase locked loop circuit producing an alternating current output signal of a predetermined frequency, circuitry for altering the bandwidth of the loop without disturbing the frequency of the output signal, comprising:
    a capacitor bearing an electrical quantity determinative of an aspect of the bandwidth;
    means for coupling a low impedance alternating current sink to the capacitor; and
    means for selectively switching the low impedance providing means into and out of circuit with said capacitor.

2. In a phase locked loop circuit as described in claim 1 wherein said means for providing a low impedance alternating current sink comprises:
    means for providing loop signals to the first plate of said capacitor;
    means for providing said loop signals to the second plate of said capacitor; and
    means for selectively coupling and decoupling said loop signals to and from said second plate of said capacitor.

3. In a phase locked loop circuit producing an alternating current output signal of a predetermined frequency, circuitry as described in claim 2 further including means for maintaining a direct current voltage on said second plate of said capacitor while said loop signals are decoupled from said second plate of said capacitor.

4. In a phase locked loop circuit producing an alternating current output signal of a predetermined frequency, circuitry as described in claim 3 wherein said means for providing loop signals to said first plate of said capacitor comprises:
    a first resistor coupled to the source of said loop signals; and
    a second resistor coupled to said first resistor and to said first plate of said capacitor, said node between the first and second resistors defining an output terminal from the circuitry.

5. In a phase locked loop circuit producing an alternating current output signal of a predetermined frequency, circuitry as described in claim 3 wherein said means for providing loop signals to said second plate of said capacitor comprises:
    an amplifier coupled to said second plate; and
    a resistor-capacitor network coupled to the input of the amplifier.

6. Circuitry for selectively altering the bandwidth of a phase locked loop frequency synthesizer without disturbing the frequency thereof, comprising:
    input means coupled to signals in the loop;
    a capacitor for determining an aspect of the bandwidth of said loop;
    means coupled to the input means, for providing said loop signals to a first plate of the capacitor;
    means coupled to the input means for providing said loop signals to a second plate of said capacitor; and
    means for selectively coupling and decoupling said loop signals providing means to and from said second plate of said capacitor.

7. Circuitry as described in claim 6 further including means for maintaining a DC voltage on said second plate of said capacitor while said loop signals are decoupled from said second plate of said capacitor.

8. Circuitry as described in claim 7 wherein said maintaining means comprises:
    an amplifier coupled to said second capacitor plate; and
    a resistor-capacitor network coupled to the input of the amplifier.

9. Circuitry as described in claim 8 wherein said selective coupling means comprises a switch.

10. In a phase locked loop frequency synthesizer, a lag network having an input and an output, comprising:
    a first resistor coupled between the input and the output;
    a second resistor coupled to the first resistor and said output;
    a capacitor coupled to the second resistor;
    means for coupling a low impedance load to said capacitor; and
    means for selectively decoupling the low impedance load from said capacitor.

11. In a phase locked loop frequency synthesizer, a lag network as described in claim 10 wherein said low impedance providing means comprises:
    a first amplifier the output of which is coupled to said capacitor;
    a capacitor coupled to the input of the first amplifier;
    a resistor coupled to the capacitor and the input of said amplifier on one end and to said selective coupling means on the other end; and
    a second amplifier having its output coupled to the resistor and said selective coupling means and its input to said input.

12. In a phase locked loop frequency synthesizer, a lag network as described in claim 11 wherein said selective coupling means is a switch coupled in parallel to said resistor.

13. A lag network for use in a phase locked loop frequency synthesizer comprising:
    input means coupled to the loop;
    output means coupled to said loop;
    a first resistor coupled between the input means and the output means;
    a second resistor coupled to said input means and the first resistor;
    a first capacitor coupled to the second resistor;
    a first amplifier having its output coupled to the first capacitor;
    a second capacitor coupled to the input of said first amplifier;
    a third resistor having a first lead coupled to the input of said first amplifier and to the second capacitor;
    switch means having a first lead coupled to said first amplifier in parallel with the third resistor; and
    a second amplifier having its output coupled to a second lead of said third resistor and a second lead of the switch means and its input coupled to said input means.

14. A lag filter network as described in claim 13 wherein said first and second amplifiers are configured for unity gain.

15. A lag filter network as described in claim 13 wherein said amplifiers are operational amplifiers.

16. In a phase-locked-loop having a phase comparator, a loop filter and a voltage-controlled-oscillator, a switchable lag network comprising:

a first resistor coupled between the loop filter and the voltage controlled oscillator;

a second resistor coupled both to the first resistor and the voltage controlled oscillator;

a capacitor having a first side coupled to the second resistor;

means coupled to a second side of the capacitor for providing a voltage related to the voltage at the output of the loop filter; and means for selectively switching said providing means into and out of electrical engagement with said capacitor.

17. A method of altering the bandwidth of a phase locked loop frequency synthesizer without disturbing the frequency of the output signal, said phase locked loop containing a voltage controlled oscillator fed through a lag network having a capacitor, comprising the steps of:

providing loop signals to a first plate of the capacitor;

providing a direct current signal to a second plate of said capacitor;

providing loop signals to the second plate of said capacitor to provide a wideband state; and selectively ceasing providing loop signals to said second capacitor plate to provide a narrowband state.

* * * * *